United States Patent [19]

Braymen

[11] Patent Number: 5,232,571
[45] Date of Patent: Aug. 3, 1993

[54] ALUMINUM NITRIDE DEPOSITION USING AN ALN/AL SPUTTER CYCLE TECHNIQUE

[75] Inventor: Steve D. Braymen, Ames, Iowa

[73] Assignee: Iowa State University Research Foundation, Inc., Ames, Iowa

[21] Appl. No.: 813,101

[22] Filed: Dec. 23, 1991

[51] Int. Cl.[5] ............................................. C23C 14/34
[52] U.S. Cl. ......................... 204/192.22; 204/192.15; 204/192.18
[58] Field of Search ..................... 204/192.12, 192.15, 204/192.18, 192.22, 298.07

[56] References Cited

U.S. PATENT DOCUMENTS

| | | | |
|---|---|---|---|
| 4,410,408 | 10/1983 | Kato et al. | 204/192.18 X |
| 4,502,932 | 3/1985 | Kline et al. | 204/192.18 |
| 4,640,756 | 2/1987 | Wang et al. | 204/192.18 |

OTHER PUBLICATIONS

Gerova et al., "Deposition . . . Sputtering", Thin Solid Films, 81 (1981), pp. 201-206.
Hata et al., "High Rate . . . Techniques", Conference: Proceedings of the 15th Electrical/Electronic Insulation Con., Chicago, USA (Oct. 1981).
Vossen et al., "Thin Film Processes", Academic Press, 1978.
Growth and Characterization of Aluminum Nitride Thin Films for Piezoelectric Devices by K. T. McCarron et al., 1988 Ultrasonics Symposium, pp. 673-676 (Oct. 1988).
Thin Film Resonators and Filters by K. M. Lakin et al., 1982 Ultrasonics Symposium, pp. 466-475.
Aluminum Nitride Thin Film and Composite Bulk Wave Resonators by K. M. Lakin et al., 36th Annual Frequency Control Symposium, pp. 517-524 (1982).
Sputtered AlN Films for Bulk-Acoustic Devices by J. S. Wang et al., 1981 Ultrasonics Symposium, pp. 502-505.
Oriented ZnO Films for Microwave Shear Mode Transducers by S. V. Krishnaswamy, Westinghouse Defense and Electronic Systems Center, date unknown.

Primary Examiner—Nam X. Nguyen
Attorney, Agent, or Firm—Leydig, Voit & Mayer

[57] ABSTRACT

A method for forming thin films of dielectric material which exhibit improved quality and piezoelectric response, which are formed in a DC magnetron reactive sputtering system. The dielectric material is deposited onto a substrate, and the deposition is interrupted before a highly insulating film is grown on the chamber interior. Then, the reactive gas is removed from the chamber and replaced with an inert gas, and a layer of metal is deposited on the chamber interior. This deposition of a metal layer conceals the highly insulating film on the chamber interior thereby improving the quality and piezoelectric response of the dielectric thin films. During the step of depositing a metal layer, the deposited substrate is shielded in order to prevent metal from being deposited on the substrate. Then, the deposition of dielectric material on the substrate and deposition of the metal layer on the chamber interior is repeatedly alternated until a desired thickness of the dielectric thin film has been reached.

13 Claims, 2 Drawing Sheets

ALUMINUM NITRIDE DEPOSITION USING AN AlN/Al SPUTTER CYCLE TECHNIQUE

FIELD OF THE INVENTION

The present invention relates to thin film resonators, and more particularly to a method for forming thin films of dielectric material used in thin film resonators.

BACKGROUND OF THE INVENTION

Thin film resonator, or TFR, technology has received much interest over the last several years. The thin film resonator technology makes possible a class of thin film microwave acoustic devices that are truly compatible with active semiconductor circuitry. The small size of the thin film resonator is compatible with semiconductor technology, and the thin film resonator can be integrated with semiconductor devices onto a common substrate.

To operate in the fundamental mode at VHF to microwave frequency ranges, a resonator must have a thickness in the range of tens of microns to less than one micron. Devices of such thicknesses are very fragile and easily damaged, and require some form of external support during and after manufacture for any practical application. This requirement has given rise to the development of etching techniques which provide for the placing of the device on a silicon substrate, with a cavity etched into the silicon underneath the device to allow free movement of the device. This permits the edges of the device to be supported by the silicon substrate.

The basic thin film resonator technology uses DC magnetron sputtered highly-oriented thin films of dielectric material, preferably aluminum nitride (AlN) or zinc oxide (ZnO). The dielectric film is sandwiched between a pair of conductive electrodes, typically thin film aluminum electrodes, and the electrodes serve not only as electrical interconnections, but also acoustic reflecting surfaces for guiding and trapping the acoustic energy in the dielectric thin film. The acoustic cavity for the resonator is defined by the aluminum-silicon composite membrane structure. That membrane should be of low mass for high frequency operation, and that, in turn usually requires the removal of substrate material underlying the membrane portion of the thin film resonator.

In order to provide quality thin film resonators, a dielectric material must be used that has strong piezoelectric properties that make it useful in building thin film resonators. Aluminum nitride, for example, is a hard dielectric material which exhibits such piezoelectric properties, with a bandgap of 6±0.5 eV. To be useful as a resonator at a given frequency, this material needs to have a corresponding thickness according to:

$$f = V_1/2T$$

where "$V_1$" is the longitudinal velocity of sound in the dielectric material of interest, "T" is the thickness and "f" is the desired frequency. For a $V_1 = 11 \times 10^5$ cm/sec along the c-axis, a 1 GHz response requires about 5 microns of aluminum nitride. At optimum parameters, this thickness requires about 90 minutes of deposition, a rather long interval.

In order to achieve the desired piezoelectric properties, the crystal grain growth of the thin films must be oriented. This orientation is controlled in the DC magnetron sputtering system with the electrostatic fields involved, the magnetic fields of the magnets, the bipolar field of the ground shield and target, and the field from the anode ring.

However, when using relatively long deposition times with a dielectric material like aluminum nitride, as aluminum nitride is deposited on the inner surfaces of the chamber of the sputtering system, the chamber becomes electrically insulated as the deposition proceeds. This in turn causes instability in the plasma and changes in the electrostatic fields. As the dielectric buildup increases, impurities from the chamber are more likely to be dislodged by stray ions and contaminate the dielectric thin films. This contamination significantly changes the uniformity and orientation of the thin films to a less desirable state, thereby decreasing the piezoelectric response of the dielectric thin films. In fact, it has been determined that these detrimental changes can significantly affect the quality of the dielectric thin films in as little as 45 minutes of deposition.

SUMMARY OF THE INVENTION

Accordingly, it is a general aim of the present invention to provide a method for forming thin films of dielectric material having improved quality and piezoelectric response.

In accomplishing that aim, it is an object of the present invention to provide a method of forming thin films of dielectric material which reduces contamination of the thin films.

It is a related object of the present invention to conceal dielectric buildup from the inner surfaces of the sputtering system chamber in which the dielectric thin films are formed in order to prevent contamination of the thin films.

It is a feature of the present invention that, during the dielectric deposition process, a layer of conductive metal is periodically deposited on the inner surfaces of the sputtering system chamber in order to conceal dielectric buildup.

It is another feature of the present invention that the deposition process is alternated between deposition of dielectric material on a semiconductor substrate and deposition of conductive metal on the inner surfaces of the sputtering system chamber until a desired thickness of the dielectric thin films has been reached.

In accordance with the present invention, a method for forming thin films of dielectric material which exhibit improved quality and piezoelectric response is provided. The dielectric thin films are formed in a DC magnetron reactive sputtering system and deposited on a semiconductor or other substrate located within a chamber of the sputtering system in the presence of a reactive gas. In the method according to the present invention, the dielectric material is deposited onto a substrate, and the deposition is interrupted before a highly insulating film is grown on the chamber interior. Then, the reactive gas is removed from the chamber and replaced with an inert gas, and a layer of metal is deposited on the chamber interior. This deposition of a metal layer conceals the highly insulating film on the chamber interior thereby improving the quality and piezoelectric response of the dielectric thin films. During the step of depositing a metal layer, the deposited substrate is shielded in order to prevent metal from being deposited on the substrate. Then, the deposition of dielectric material on the substrate and deposition of the metal layer on the chamber interior is repeatedly alternated until a desired thickness of the dielectric thin film has been reached.

DETAILED DESCRIPTION OF PREFERRED EMBODIMENT

While the invention will be described in connection with a preferred embodiment, there is no intent to limit the invention to this embodiment. On the contrary, the intent is to cover all alternatives, modifications, and equivalents included within the spirit and scope of the invention as defined in the appended claims.

Figure 1:
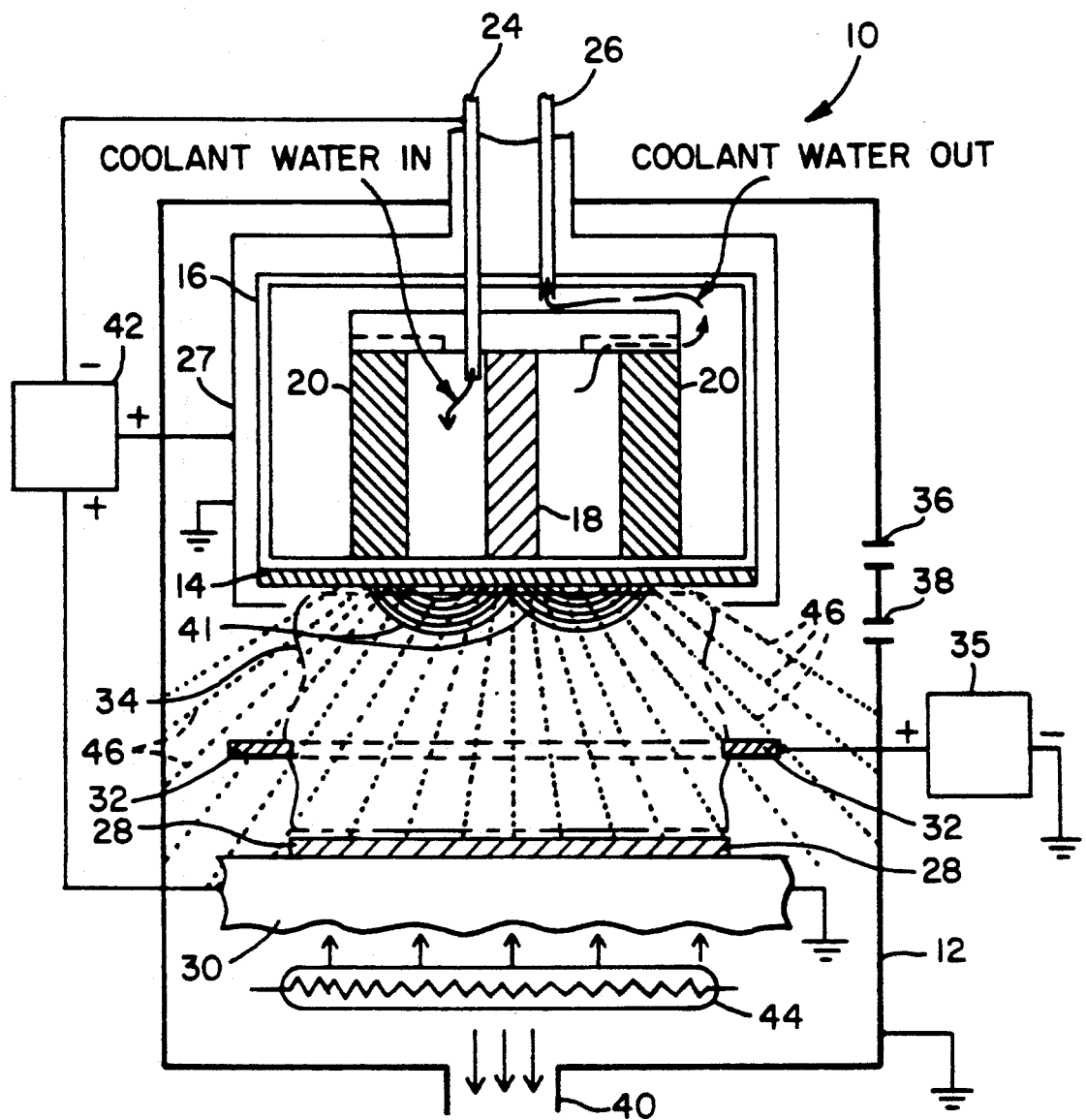
FIG. 1 is a sectional side view showing the DC magnetron reactive sputtering system used to form dielectric thin films according to the method of the present invention.

Turning now to the drawings, FIG. 1 is a sectional side view illustrating the DC magnetron reactive sputtering system (not to scale) used in the method according to the present invention of forming dielectric thin films. FIG. 1 shows a DC magnetron reactive sputtering system 10 which includes a gas chamber 12 surrounding the various components of the sputtering system. In order to fabricate the dielectric thin films, which are used as the piezoelectric layers of thin film resonators as discussed above, a metal target 14 is positioned within the chamber 12. The metal target 14 is secured to a sputtering head 16, which includes a pole magnet 18 and a ring magnet 20 for generating a magnetic field. Additionally, the sputtering head 16, which is electrically insulated from the chamber 12, includes a cooling water inlet 24, a cooling water outlet 26, and a ground shield 27.

A single silicon substrate 28 is positioned on a holder 30 across from the metal target 14. An anode ring 32 is positioned between the metal target 14 and the substrate 28 in order to contain and stabilize a plasma 34 between the metal target 14 and the substrate 28. The anode ring 32 typically has a potential of 60 volts, which is provided by a power supply 35. The sputtering system 10 also includes inlet valves 36 and 38 for introducing the reactive and inert gases, respectively, into chamber 12, and a vacuum pump 40 for evacuating the gases from chamber 12. The magnets 18 and 20 provide a magnetic field, shown as magnetic flux lines 41, Which allows for the generation of the plasma 34 at lower voltages as compared to the DC diode technique or other non-magnetron DC systems which typically use 1000 volts. The sputtering system 10 also utilizes a second power source 42 which acts as a current source, having its negative terminal connected to the water inlet 24 and its positive terminal connected to the chamber 12, substrate 28 and holder 30 which are connected to ground. Power source 42, in the preferred implementation, is an 1800 watt, 600 volt DC power supply. Finally, a quartz heater 44 is shown for heating the holder 30 and substrate 28.

In the reactive sputtering system 10, the dielectric thin films are formed by generating the plasma 34 which contains a large number of positively charged ions 46. These positively charged ions 46 accelerate into the metal target 14 knocking loose atoms of the particular metal, which in the preferred embodiment is a very pure (99.999%) aluminum target. The aluminum atoms then traverse the chamber 12 and deposit on available surfaces as shown in FIG. 1. In order to form the preferred dielectric material of aluminum nitride for the thin films, nitrogen is introduced into the chamber 12 through the inlet valve 36. In the presence of this reactive gas, the aluminum atoms will form compounds such as aluminum nitride. Thus, the aluminum nitride particles deposit on the substrate 28 in order to form the AlN thin films.

As explained in greater detail below, the present invention provides a method for forming dielectric thin films having improved quality and piezoelectric response. Briefly, the method of the present invention comprises depositing the dielectric material on the substrate 28, and interrupting the dielectric material deposition before a highly insulating film is grown on the chamber interior. Then, during the interruption, the reactive gas is replaced with an inert gas and a layer of aluminum is deposited on the interior of the chamber 12. This aluminum film conceals (i.e., masks or covers) the highly insulating film on the chamber interior thereby reducing contamination and improving the quality and piezoelectric response of the dielectric thin films. The deposited substrate is shielded with a shutter (not shown) during the deposition of the aluminum film to prevent aluminum from being deposited on the substrate. Then, the deposition of the dielectric material (AlN) on the substrate and the deposition of the aluminum film on the chamber interior is repeatedly alternated until a desired thickness of the dielectric thin film is reached.

Figure 2:
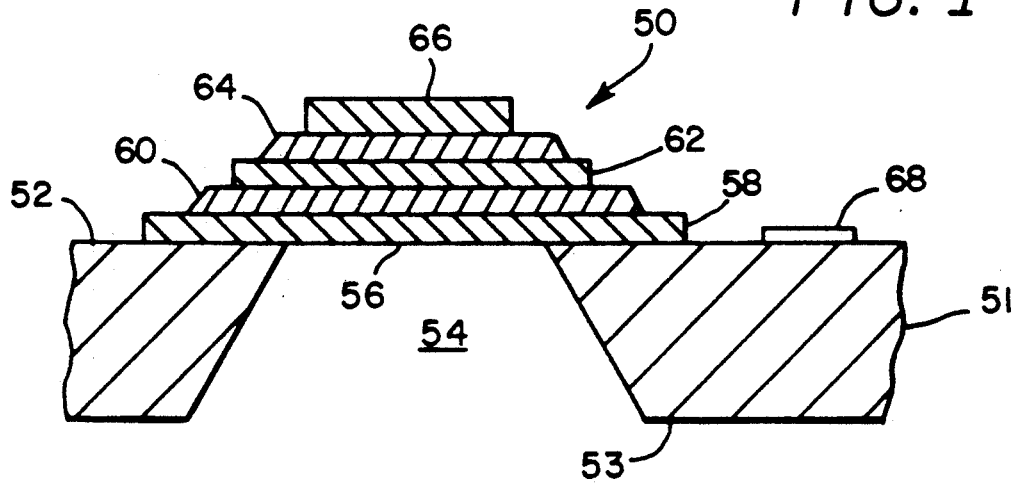
FIG. 2 is a diagram schematically illustrating a thin film resonator in the form of a stacked crystal filter.

Turning now to FIG. 2, there is shown a thin film resonator in the form of a stacked crystal filter 50, which is just one device that can utilize the dielectric thin films formed in accordance with the method of the present invention as explained in detail below. The filter 50 is based on a semiconductor substrate 51, which has upper 52 and lower 53 opposed surfaces, which are generally planar and parallel. A ia 54 formed below the stacked crystal filter 50 frees a membrane portion 56 for acoustic vibration so that the thin film resonator can operate in the fundamental mode.

The stacked crystal filter 50 includes a lower metal electrode 58 and a first piezoelectric thin film 60, an intermediate metal electrode 62, a second piezoelectric thin film 64, and an upper metal electrode 66. The metal electrodes 58, 62 and 66 are typically thin film electrodes deposited as by sputtering or electron beam evaporation. It is important that the metallic layer forming metal electrodes 58 and 62 be smooth, thin and continuous to provide a smooth surface for receiving a highly oriented thin film of dielectric material. The piezoelectric thin films 60 and 64 are deposited as by DC magnetron sputtering as explained in connection with FIG. 1, following which the upper electrode 66 is deposited. It should be understood that because the piezoelectric thin films 60 and 64 are formed with a dielectric material such as AlN, films 60 and 64 may also be referred to as "dielectric thin films."

The piezoelectric thin films together are typically a total of about 5 microns thick in order to provide a resonator frequency response in the range of 1 GHz. A portion or via 54 of the substrate 51 is removed from beneath the central portion of the resonator, providing for free vibration of the resonator. As explained in commonly assigned U.S. patent application Ser. No. 622,251 entitled "High Frequency Oscillator Comprising Co-integrated Thin Film Resonator And Active Device," now U.S. Pat. No. 5,075,061, issued Dec. 24, 1991, an additional electronic device 68 can be formed on the substrate 51, which can then be etched without damage to the device 68.

The thin film resonator is formed on the substrate 51 at a time when the substrate is strong and capable of withstanding the various processes for formation of the foregoing elements. Having formed the thin film resonator, metallization for contacts, and interconnections to the electronic device 68 if desired, the partly formed device is then subjected to an etching step which removes all or at least a portion of the substrate materials from below the membrane portion 56 of the thin film resonator. As set forth in commonly assigned, co-pending U.S. patent application Ser. No. 813,152 filed Dec. 23, 1991, entitled "Selective Etching Process" the etching step is adapted to selectively etch the pure silicon of the substrate, while being relatively non-reactive to the materials formed on the upper surface of the device, such as the metallization and the dielectric materials which are exposed on the upper surface 52 of the substrate 51. Thus, the process steps provide for a relatively non-fragile wafer during the numerous steps needed to deposit the dopant impurities, perform the lithographic steps, etching steps, sputtering steps, and the like. Then, late in the process, after the majority of the process steps are completed, the necessary material to free the resonator is etched away, but accomplished in such a way that the delicate and previously formed thin film resonator is not damaged. The ability to accomplish that is particularly significant when one notes that the mass and size of the silicon which must be removed from below the resonator is orders of magnitude greater than the mass and size of the portions of the device which must be protected.

As discussed above, the aluminum nitride thin film is a highly oriented and very pure film formed by sputter deposition. In accordance with the method of the present invention, it has been found desirable to utilize specialized techniques in forming AlN thin films to account for the relatively long deposition times which are required. Those techniques, as explained in greater detail below, involve utilization of a DC magnetron reactive sputtering system, which in one implementation as explained above, uses an 1800 watt, 600 volt DC power supply as the current source. Typical operating parameters for the sputtering system are 3 mTorr pressure, 0.75 amp current with a voltage drop across the nitrogen plasma of about 350 volts.

As noted above, the aluminum nitride film is preferably about 5 microns in thickness in order to provide resonator response at about 1 GHz. At optimum deposition parameters, approximately 90 minutes of deposition are required. In addition, the crystal grain growth must be oriented in order to provide the required piezoelectric response.

As aluminum nitride is deposited on the inner surfaces of the chamber 12 during those relatively long deposition times, the chamber becomes electrically insulated. The plasma becomes less stable, and the electrostatic fields change. Impurities from the chamber surfaces are then more likely to be dislodged from the chamber by stray ions, which can deposit in the aluminum nitride film forming on the semiconductor substrate, thus contaminating the thin film. The orientation of the film itself can change to a less desirable one, thereby decreasing its piezoelectric response. It has been found that these changes can significantly affect the quality of the aluminum nitride film in as little as 45 minutes of dielectric deposition.

Figure 3:
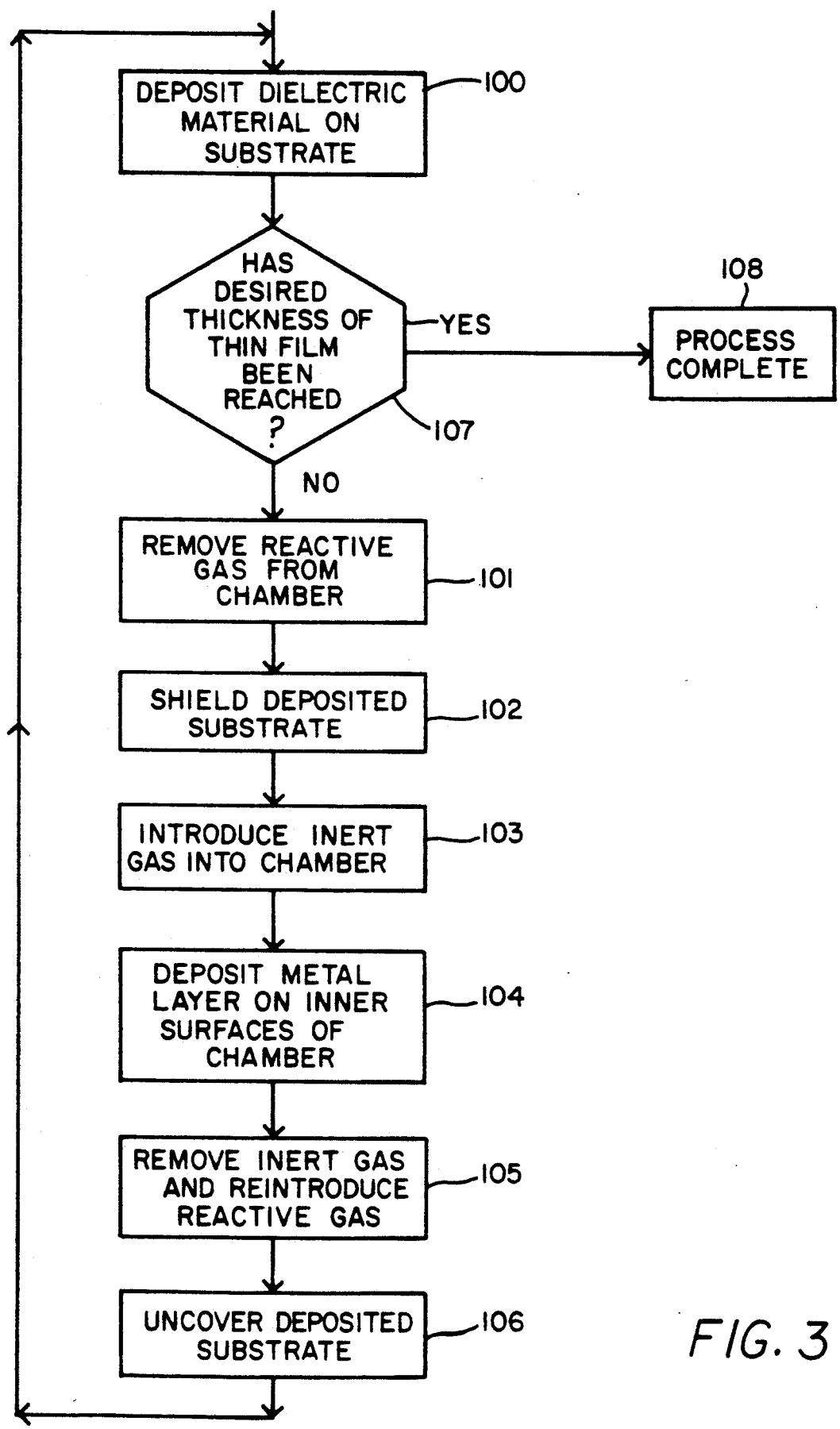
FIG. 3 is a flow diagram illustrating the steps according to the method of the present invention.

In accordance with the present invention, a method for forming the dielectric thin films is provided to reduce contamination of the thin films thereby improving their quality and piezoelectric response. FIG. 3 is a flow diagram illustrating the process steps according to the method of the present invention. During the relatively lengthy deposition procedure for depositing the AlN on the silicon substrate shown as step 100, a layer of aluminum metal is periodically deposited over the aluminum nitride buildup on the interior of the chamber 12. The concealment (i.e., masking) of highly insulating AlN buildup prevents contamination of the AlN thin films during the deposition process. This is accomplished with the method according to the present invention by changing the reactive gas in the chamber to argon, or another inert gas, in place of the nitrogen for a brief period, as shown in FIG. 3 as steps 101 and 103. To prevent the wafer from being coated with the aluminum during this periodic "cleansing" process, a shutter (not shown) is moved into place over the substrate to act as a shield (step 102).

Thus, at periodic intervals, such as about 30 minutes, during the deposition of the aluminum nitride material, the shutter is closed and the nitrogen atmosphere replaced with argon to coat the chamber interior with an aluminum film, illustrated in FIG. 3 as step 104. After a brief period, such as about 5 minutes, the argon is then removed from the chamber and the nitrogen atmosphere returned (step 105), following which the shutter is opened (step 106) and aluminum nitride deposition continued until the required thickness has been built up. The alternating of AlN and Al deposition (with shutter closed during Al deposition) is repeated until the required amount of AlN has been deposited on the semiconductor substrate, shown in FIG. 3 as blocks 107 and 108. The aluminum film provides conduction paths and grounded surfaces for the electrical currents where it would otherwise be insulated with the AlN buildup. This provides stability to the process and reduces contamination. Dielectric buildup is also removed from the aluminum target 14 during the metal deposition in order to reveal fresh metal surfaces for continued processing.

In the above description, the method of the present invention has been described in connection with the production of the preferred dielectric material, aluminum nitride. It should be understood, however, that the invention is not limited only to the formation of aluminum nitride thin films. On the contrary, the method of the present invention can be utilized to form thin films of other dielectric materials such as zinc oxide or silicon oxide.

As is evident from the foregoing description, the method according to the present invention prevents contamination of the dielectric thin films during the lengthy deposition process. Thus, the method of the present invention produces substantially purer dielectric thin films with improved quality and conventional sputtering techniques.

I claim:

1. A method of fabricating a thin film resonator comprising at least one dielectric thin film layer sandwiched between two conductive thin film electrode layers, the method comprising the steps of:

(a) depositing a smooth, uniform metal layer on a substrate to serve as a first electrode;

(b) placing the substrate with deposited first electrode in a DC magnetron reactive sputtering system for an extended deposition cycle to product the dielectric thin film, the reactive sputtering system including a chamber having interior and exterior surfaces;

(c) initiating a sputtering cycle with a pure aluminum target and a nitrogen reactive gas to form the dielectric thin film comprising a thin uniform highly-oriented aluminum nitride film on the first electrode;

(d) interrupting the sputtering cycle while the dielectric aluminum nitride film is being formed but before a highly insulating film of aluminum nitride is grown on the chamber interior and, during said interruption:

(i) shielding the substrate with deposited first electrode and partially formed dielectric aluminum nitride film; and (ii) temporarily introducing an inert gas in place of the reactive gas to deposit a thin conductive film over the highly insulating aluminum nitride film grown on the chamber interior to prevent contamination of the dielectric aluminum nitride film;

(e) repeating steps (c) and (d) until the dielectric aluminum nitride film deposited on the first electrode is of the desired thickness; and (f) depositing a second metal electrode over the dielectric thin film, thereby to produce a resonator with smooth electrodes encompassing a thin, highly-oriented piezoelectric film substantially free of contaminants dislodged from the reactive sputtering system.

2. The method of claim 1 wherein the dielectric thin film is about 5 microns thick to provide a resonator response at about 1 GHz.

3. The method of claim 1 wherein the inert gas is argon.

4. A method for forming thin films of a dielectric material which exhibit improved quality and piezoelectric response, the dielectric thin films being formed in a DC magnetron reactive sputtering system in the presence of a reactive gas and deposited on a substrate located within a chambers of the sputtering system with the chamber having interior and exterior surfaces, the method comprising the steps of:

depositing the dielectric material on the substrate;

interrupting the step of depositing dielectric material while the dielectric thin film is being formed but before a highly insulating film is grown on the chamber interior;

replacing the reactive gas with an inert gas during the step of interrupting and depositing a layer of conductive metal on the chamber interior in order to conceal the highly insulating film thereby reducing contamination and improving the quality and piezoelectric response of the dielectric thin films;

shielding the substrate with partially deposited dielectric material during the step of depositing the conductive metal layer in order to prevent metal from being deposited on the substrate with partially deposited dielectric material; and repeatedly alternating the deposition of the dielectric material on the substrate and the metal layer on the chamber interior until a desired thickness of the dielectric thin film has been reached.

5. The method of claim 4 wherein the reactive gas is nitrogen, the metal is aluminum, and the dielectric material is aluminum nitride.

6. The method of claim 4 wherein the inert gas is argon.

7. The method of claim 4 wherein he reactive gas is oxygen, the metal is zinc, and the dielectric material is zinc oxide.

8. The method of claim 4 wherein the dielectric thin films are utilized in a thin film resonator having a resonator response at about 1 GHz.

9. A method for preventing contamination of thin films of a dielectric material formed in a DC magnetron reactive sputtering system, the dielectric thin films being deposited on a substrate located in a chamber of the sputtering system in the presence of a reactive gas with the chamber having interior and exterior surfaces, the method comprising the steps of:

(a) depositing the dielectric material onto the substrate;

(b) interrupting the step of depositing dielectric material while the dielectric thin film is being formed but before a highly insulating film is grown on the chamber interior;

(c) removing the reactive gas from the chamber;

(d) shielding the substrate with partially deposited dielectric material in order to temporarily prevent deposition from occurring thereon;

(e) introducing an inert gas into the chamber;

(f) depositing a layer of conductive metal on the chamber interior in order to conceal the highly insulating film on the chamber interior thereby reducing contamination and improving he quality and piezoelectric response of the dielectric thin films;

(g) removing the inert gas and reintroducing the reactive gas into the chamber;

(h) uncovering the substrate with partially deposited dielectric material; and (i) repeatedly performing steps (a) through (h) until a desired amount of dielectric material is deposited on the substrate.

10. The method of claim 9 wherein the reactive gas is nitrogen, the metal is aluminum, and the dielectric material is aluminum nitride.

11. The method of claim 9 wherein the inert gas is argon.

12. The method of claim 9 wherein the reactive gas is oxygen, the metal is zinc, and the dielectric material is zinc oxide.

13. The method of claim 9 wherein the dielectric thin films are utilized in a thin film resonator having a resonator response at about 1 GHz.

* * * * *

UNITED STATES PATENT AND TRADEMARK OFFICE
CERTIFICATE OF CORRECTION

PATENT NO. : 5,232,571
DATED : August 3, 1993
INVENTOR(S) : Steve D. Braymen

It is certified that error appears in the above-identified patent and that said Letters Patent is hereby corrected as shown below:

Column 1, line 1, after the title, insert the following:

-- This invention was made with Government support under Contract No. ITA 87-02 awarded by U.S. Department of Commerce. The Government has certain rights in the invention. --

Signed and Sealed this

Seventeenth Day of January, 1995

Attest:

BRUCE LEHMAN

Attesting Officer

Commissioner of Patents and Trademarks